United States Patent
Ma

[19]

[11] Patent Number: 6,089,900
[45] Date of Patent: Jul. 18, 2000

[54] FOLDABLE RETENTION MECHANISM FOR ELECTRONIC DEVICE

[75] Inventor: Hao-Yun Ma, Taipei, Taiwan

[73] Assignee: Hon Hai Precision Ind. Co., Ltd., Taipei Hsien, Taiwan

[21] Appl. No.: 09/344,158

[22] Filed: Jun. 24, 1999

[30] Foreign Application Priority Data

Dec. 22, 1998 [TW] Taiwan ................................. 87221335

[51] Int. Cl.[7] ................................................ H01R 13/64
[52] U.S. Cl. ........................................... 439/377; 439/327
[58] Field of Search ................................... 439/325–328, 439/377

[56] References Cited

U.S. PATENT DOCUMENTS

| | | | |
|---|---|---|---|
| 4,080,031 | 3/1978 | Sawford-Atkins | 439/377 |
| 5,889,656 | 3/1999 | Yin | 439/377 |
| 5,928,024 | 7/1999 | Ming-Huang | 439/377 |

*Primary Examiner*—Gary F. Paumen
*Attorney, Agent, or Firm*—Wei Te Chung

[57] ABSTRACT

A retention mechanism for retaining a CPU module includes a base with two spaced side walls formed on each end thereof and trunnions transversely extending therefrom. A pair of retention arms each forming a channel for receiving an edge of the CPU module has two lateral walls fit over the side walls at opposite ends of the base. Each lateral wall of the retention arm defines a pivot hole for pivotally receiving the corresponding trunnion therein thereby rendering the retention arm pivotal with respect to the base between an expanded position wherein the retention mechanism forms a U-shaped configuration for accommodating the CPU module and a folded position wherein the retention arm substantially overlaps the base for conserving space. Each end of the base forms at least one projection for selectively engaging with a first recess and a second recess defined in the corresponding lateral wall of the retention arm for releasably fixing the retention arm at the expanded position and the folded position.

1 Claim, 7 Drawing Sheets

FOLDABLE RETENTION MECHANISM FOR ELECTRONIC DEVICE

BACKGROUND OF THE INVENTION

1. Field of the Invention

The present invention generally relates to a retention mechanism for retaining a central processing unit (CPU) module, and in particular to a foldable retention mechanism.

2. The Prior Art

A retention mechanism having two retention arms for retaining a CPU module therein is well known in the electronics field. Examples are disclosed in Taiwan Patent Application Nos. 85216150, 86207711, 86207803 and 86209531. The conventional retention mechanism comprises a base and two retention arms extending from opposite ends thereof to form a U-shaped configuration for receiving a CPU module therein. The retention arms of the conventional retention mechanisms are not foldable whereby the retention mechanism occupies a large space especially when not in use. To overcome such a problem, the retention mechanism is provided with foldable retention arms pivotally attached to the base and releasably retained at an expanded position for receiving the CPU module.

The conventional foldable retention mechanism has retention arms which are not secured in position when the retention arms are folded. Thus, the retention arms are free to pivot and may cause undesired damage to the retention mechanism.

It is thus desired to have a foldable retention mechanism that fixes retention arms thereof at a folded position for overcoming the problem discussed above.

SUMMARY OF THE INVENTION

Accordingly, an object of the present invention is to provide a foldable retention mechanism that releasably fixes retention arms thereof at a folded position thereby preventing free movement of the folded retention arms.

To achieve the above object, a foldable retention mechanism in accordance with the present invention comprises a base with two spaced side walls formed on each end thereof and trunnions transversely extending therefrom. A pair of retention arms each forming a channel for receiving an edge of the CPU module has two lateral walls fit over the side walls at opposite ends of the base. Each lateral wall of the retention arm defines a pivot hole for pivotally receiving the corresponding trunnion therein thereby rendering the retention arm pivotal with respect to the base between an expanded position wherein the retention mechanism forms a U-shaped configuration for accommodating the CPU module and a folded position wherein the retention arm substantially overlaps the base for conserving space. Each end of the base forms at least one projection for selectively engaging with a first recess and a second recess defined in the corresponding lateral wall of the retention arm for releasably fixing the retention arm at the expanded position and the folded position.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
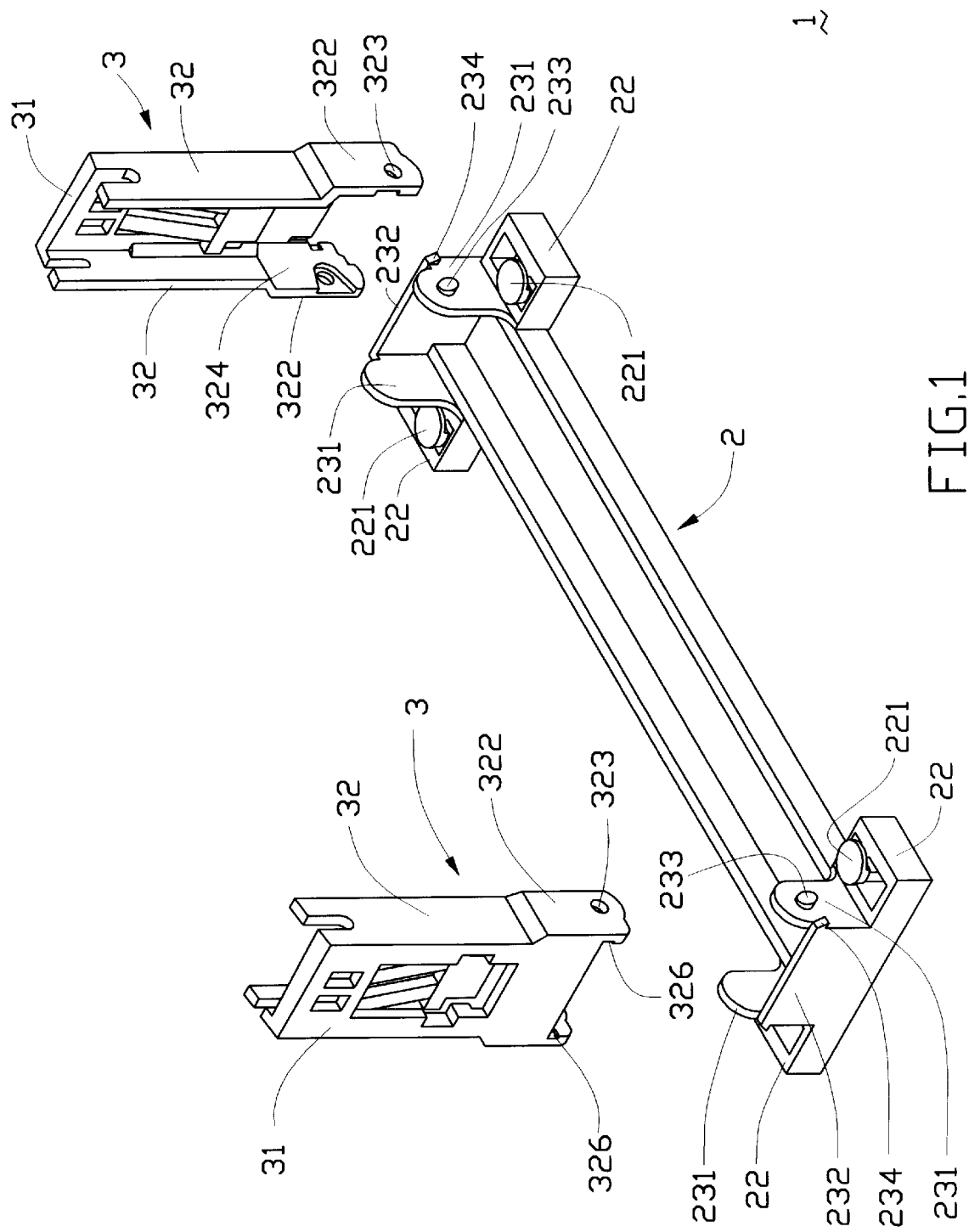
FIG. 1 is an exploded view of a foldable retention mechanism constructed in accordance with the present invention.
Figure 2:
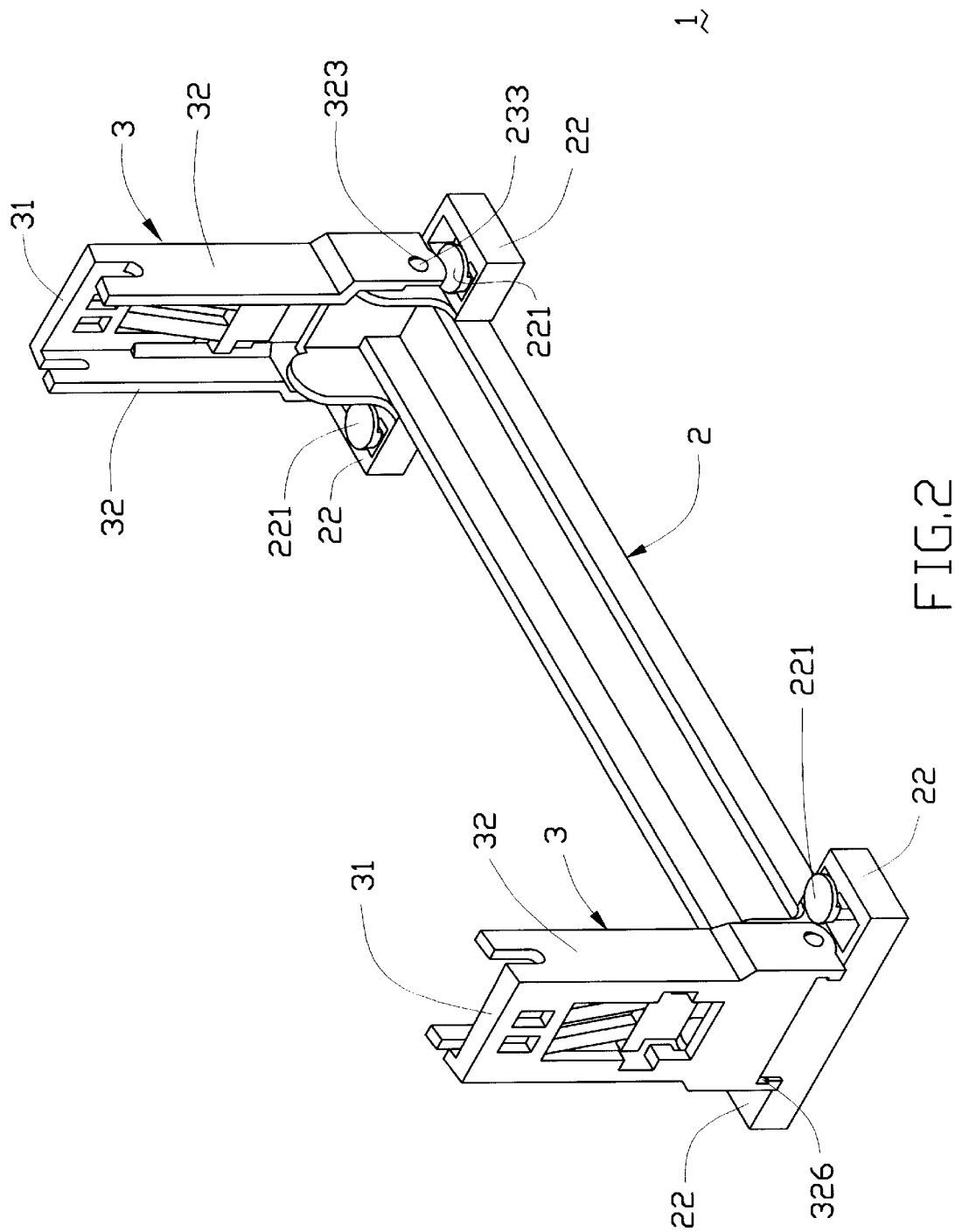
FIG. 2 is an assembled view of FIG. 1.

Referring to the drawings and in particular to FIGS. 1 and 2, a foldable retention mechanism 1 constructed in accordance with the present invention comprises an elongate base 2 with two side extensions 22 formed at each end thereof for being mounted to a circuit board (not shown) by means of fasteners 221. Two spaced side walls 231 are formed at each end of the base 2 and an end wall 232 is formed between the side walls 231. Each side wall 231 has a trunnion 233 transversely extending therefrom.

Figure 3:
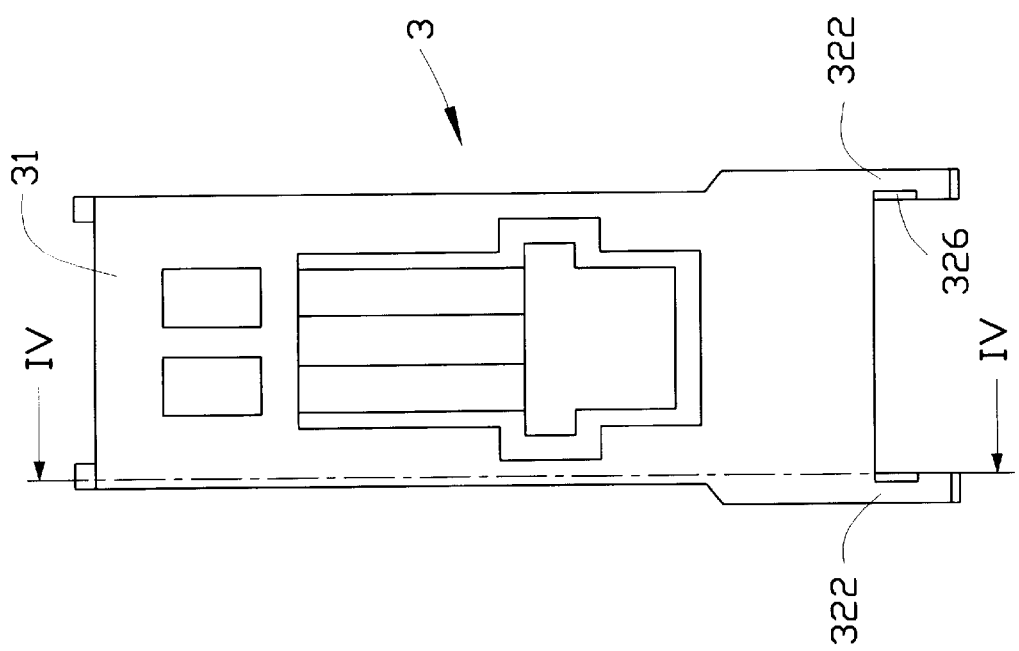
FIG. 3 is an elevational view of a retention arm of the foldable retention mechanism of the present invention.
Figure 6:
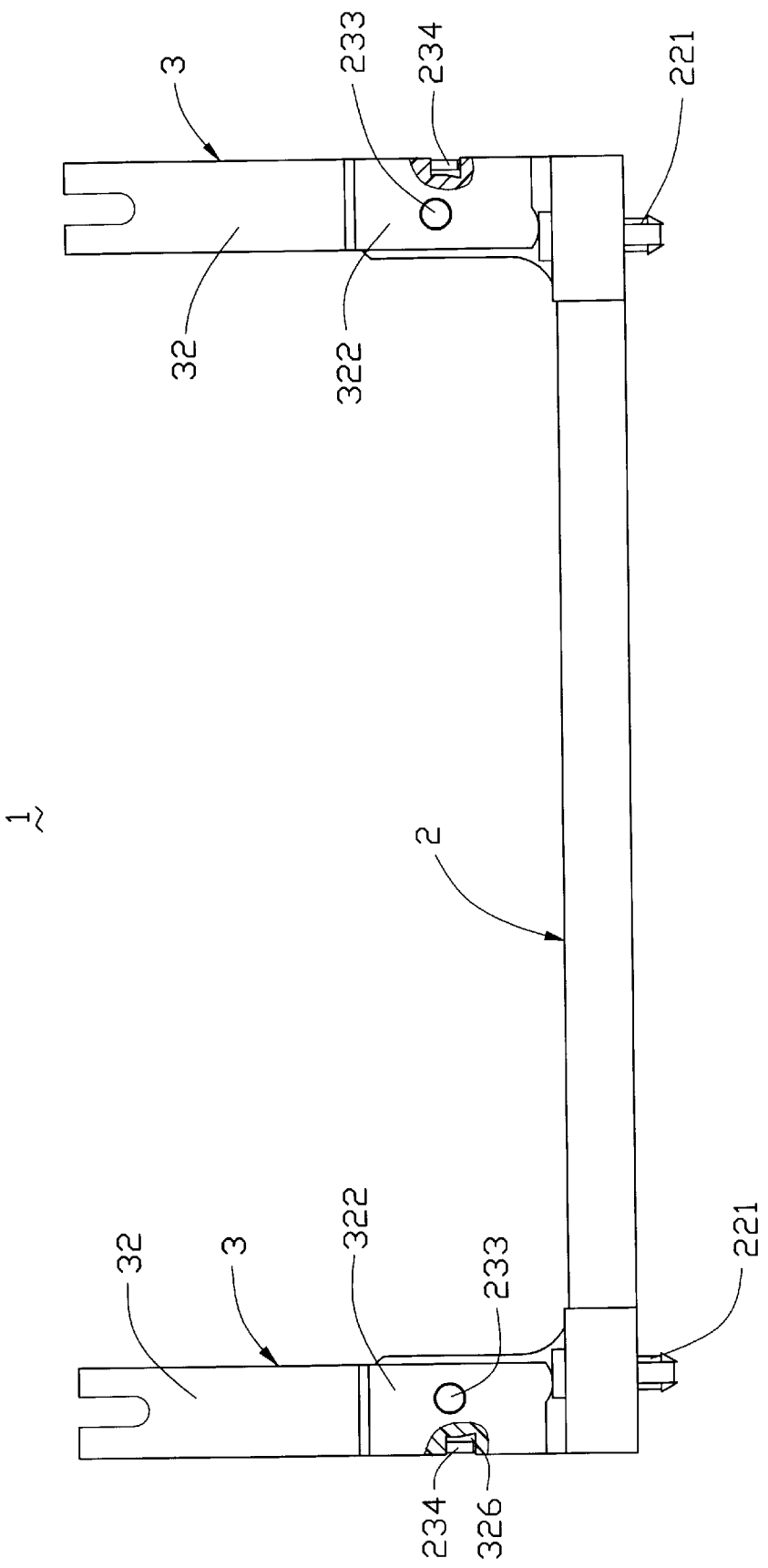
FIG. 6 is a side elevational view of the foldable retention mechanism at an expanded position.
Figure 7:
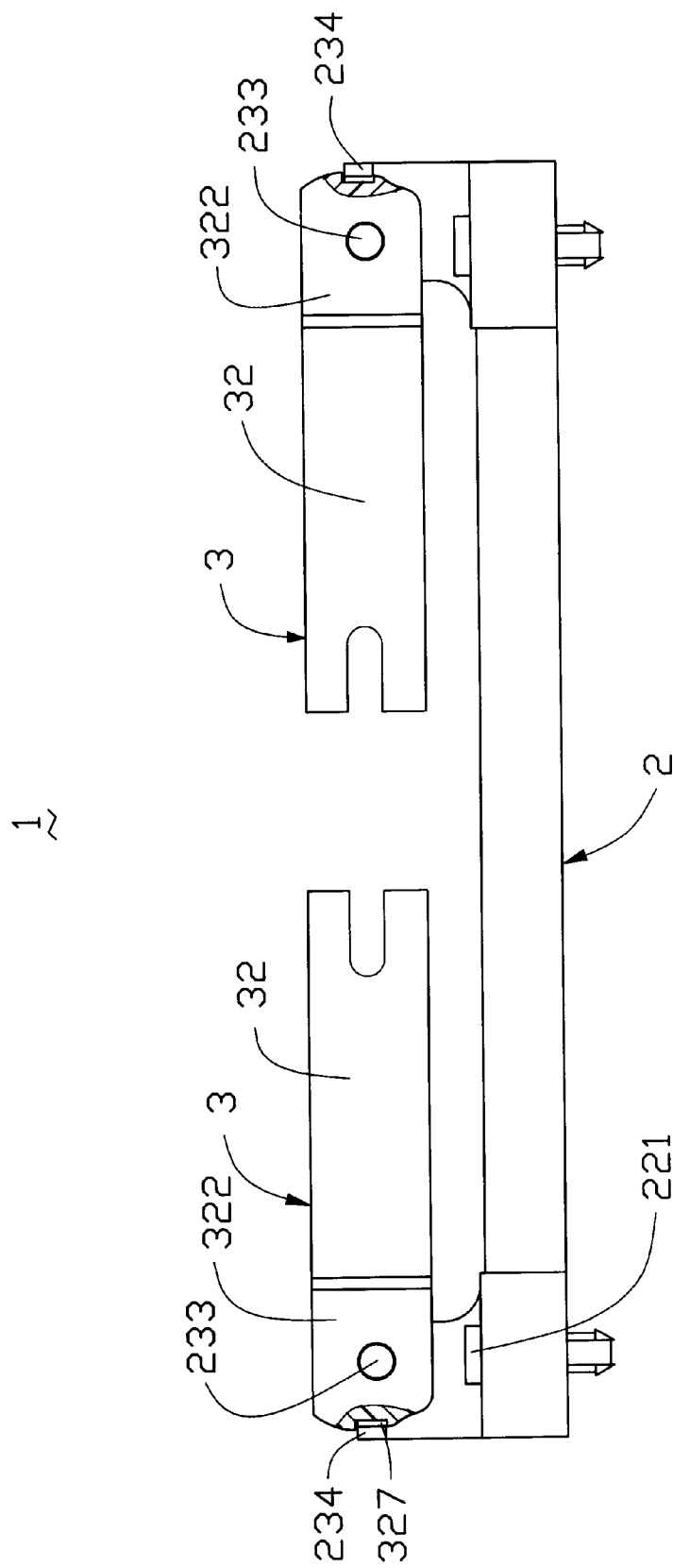
FIG. 7 is a side elevational view of the foldable retention mechanism at a folded position.

The foldable retention mechanism 1 also comprises two retention arms 3 each having a bottom wall 31 and two spaced lateral walls 32 defining a channel (not labeled) for receiving an edge of a CPU module (not shown) for mounting the CPU module to the circuit board. Each lateral wall 32 has a lower extension 322 (also see FIG. 3) fit over the corresponding side wall 231 of the base 2 with an inside face 324 thereof abutting against the side wall 231. A pivot hole 323 is defined in the lateral wall 32 for pivotally receiving the corresponding trunnion 233 therein thereby rendering the retention arm 3 pivotal with respect to the base 2 between an expanded position (FIG. 6) and a folded position (FIG. 7).

Figure 4:
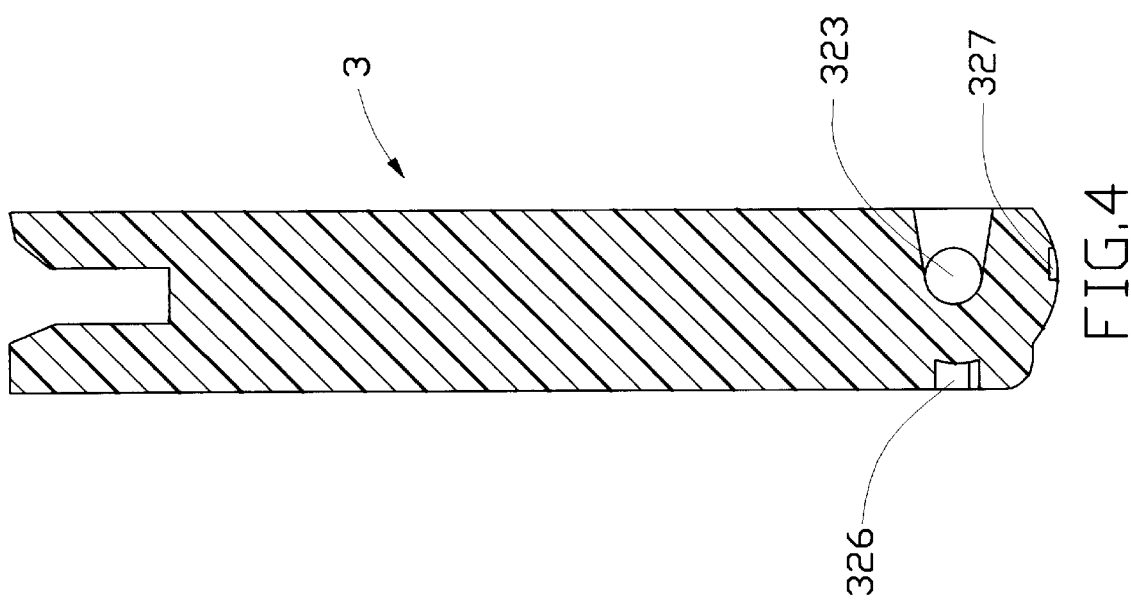
FIG. 4 is a cross-sectional view taken along line IV—IV of FIG. 3.
Figure 5:
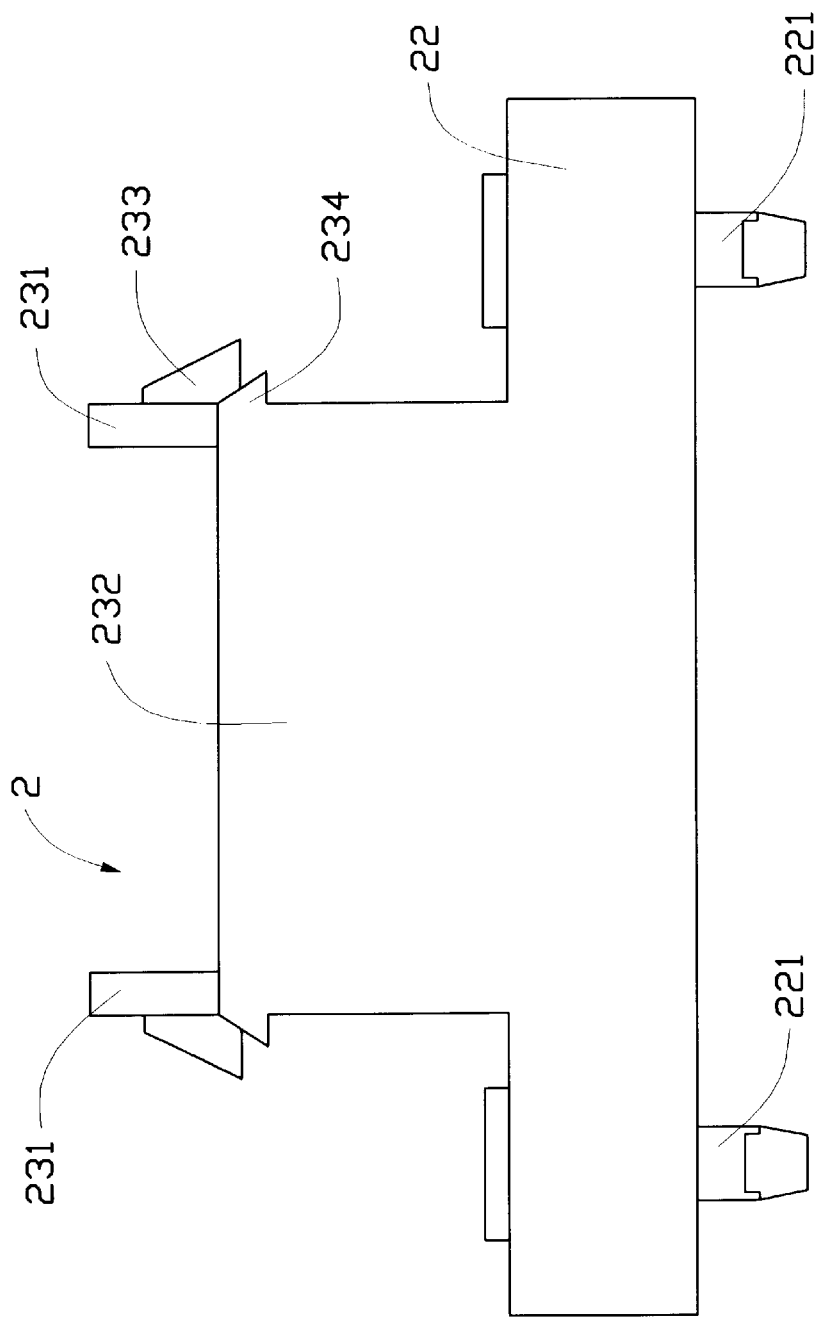
FIG. 5 is an end view of a base of the foldable retention mechanism of the present invention.

Each end wall 232 of the base 2 has two sideways projections 234 (FIG. 5) which are selectively snappingly fit into first and second recesses 326, 327 (FIG. 4) defined in the inside face 324 of each lower extension 322 of the corresponding retention arm 3 for releasably retaining the retention arm 3 at the expanded and folded positions.

When the retention arms 3 are at the expanded position, the retention arms 3 are fixed by means of the engagement between the projections 234 of the base 2 and the first recesses 326 of the retention arms 3 (FIG. 6) which forms a U-shaped configuration capable for receiving the CPU module therein. When the retention arms 3 are at the folded position, the retention arms 3 are pivoted to contact the base 2 and are fixed by means of the engagement between the projections 234 and the second recesses 327 of the retention arms 3 (FIG. 7) thereby preventing the retention arms 3 from free movement and reducing the likelihood of undesired damage caused thereby.

Although the present invention has been described with reference to the preferred embodiment, it is apparent to those skilled in the art that a variety of modifications and changes may be made without departing from the scope of the present invention which is intended to be defined by the appended claims.

What is claimed is:

1. A retention mechanism comprising a base and a pair of retention arms respectively pivotally attached to two opposite ends thereof, said base defining two spaced side walls with an end wall bridging therebetween at either end, each of said retention arms defining two spaced lateral walls with a bottom wall therebetween, a pair of projections each outwardly protruding from a top portion of the end wall and close to an intersection of the end wall each corresponding side wall, and a pair of first recesses each formed within the corresponding lateral wall and close to an intersection of the bottom wall and the corresponding lateral wall, whereby when the retention arm is pivotably moved to a vertical expanded position with regard to the base, the bottom wall of the retention arm is aligned with the end wall of the base, and the projections of the end wall are respectively received within the corresponding recesses in the lateral arms, the retention arms having second recesses which receive the corresponding projections to releasably fix the retention arms in a folded position.

* * * * *